United States Patent [19]

Mori et al.

[11] Patent Number: 5,718,772
[45] Date of Patent: *Feb. 17, 1998

[54] SOLAR CELL HAVING EXCELLENT WEATHER RESISTANCE

[75] Inventors: Takahiro Mori, Ikoma; Ichiro Kataoka; Satoru Yamada, both of Tsuzuki-gun; Shigenori Itoyama, Nara, all of Japan

[73] Assignee: Canon Kabushiki Kaisha, Tokyo, Japan

[*] Notice: The term of this patent shall not extend beyond the expiration date of Pat. No. 5,578,141.

[21] Appl. No.: 705,995

[22] Filed: Aug. 30, 1996

Related U.S. Application Data

[63] Continuation of Ser. No. 392,789, filed as PCT/JP94/01081, Jul. 1, 1994, Pat. No. 5,578,141.

[30] Foreign Application Priority Data

Jul. 1, 1993 [JP] Japan ................... 5-163488

[51] Int. Cl.⁶ ................................. H01L 31/048
[52] U.S. Cl. ........................... 136/251; 136/259
[58] Field of Search ..................... 136/251, 259; 257/433, 789, 795

[56] References Cited

U.S. PATENT DOCUMENTS

| | | | |
|---|---|---|---|
| 4,692,557 | 9/1987 | Samuelson et al. | 136/251 |
| 5,344,498 | 9/1994 | Inoue | 136/251 |
| 5,389,159 | 2/1995 | Kataoka et al. | 136/251 |
| 5,397,401 | 3/1995 | Toma et al. | 136/259 |
| 5,447,576 | 9/1995 | Willis | 136/259 |
| 5,578,141 | 11/1996 | Mori et al. | 136/251 |

FOREIGN PATENT DOCUMENTS

| | | | |
|---|---|---|---|
| 59-16388 | 1/1984 | Japan | 136/251 |
| 60-1875 | 1/1985 | Japan | 136/251 |
| 61-5583 | 1/1986 | Japan | 136/251 |
| 61-69179 | 4/1986 | Japan | 136/251 |
| 63-99581 | 4/1988 | Japan | 136/251 |
| 3-22572 | 1/1991 | Japan | 136/251 |

*Primary Examiner*—Aaron Weisstuch
*Attorney, Agent, or Firm*—Fitzpatrick, Cella, Harper & Scinto

[57] ABSTRACT

A solar cell module in which at least the light receiving surface side of a photovoltaic element is coated with a filler, characterized in that the filler is made of a composition containing vinylidene fluoride copolymer and acrylic resin. The solar cell module is excellent in weather resistance, heat resistance, adhesion to a photovoltaic element (solar cell), and scratch resistance. Moreover, it is capable of minimizing the deterioration of the performance of the solar cell due to moisture permeability, thereby achieving a desirable photoelectric conversion efficiency over a long period of time.

2 Claims, 2 Drawing Sheets

SOLAR CELL HAVING EXCELLENT WEATHER RESISTANCE

This application is a continuation of application Ser. No. 08/392,789, filed Apr. 7, 1995, now U.S. Pat. No. 5,578,741, issued Nov. 26, 1996, which is the national application of PCT application JP94/01081, filed Jul. 1, 1994.

BACKGROUND OF THE INVENTION

1. Field of the Invention

The present invention relates to a solar cell module having excellent weather resistance. More particularly, the present invention concerns an improved solar cell module in which at least the light receiving surface of a photovoltaic element (or solar cell) in the solar cell module is coated with a composition containing vinylidene fluoride copolymer and acrylic resin for achieving a desirable photoelectric conversion efficiency over a long period of time even in a severe environment.

2. Related Art

A number of thin film solar cells have been proposed. An amorphous silicon thin film solar cell (a-Si thin film solar cell) is representative of these thin film solar cells. As the a-Si thin film solar cell, there has been known a solar cell having a construction in which an a-Si semiconducting film as a photoelectric conversion element is provided on a conductive substrate made of a metal layer and a transparent conductive layer is provided on the semiconducting film. In the case where the a-Si thin film solar cell having such a construction is used as a power supplying means, differently from a solar cell of a type in which a glass plate is used as a substrate, a light incident surface of the a-Si thin film solar cell is provided with a means for protecting the surface, that is, a transparent coating material. As the protective means, there is known a construction in which a transparent surface resin layer composed of a fluoride polymer thin film such as a fluororesin film or fluororesin paint is provided on the outermost surface side, and a filler composed of various transparent thermoplastic organic resins is provided below the surface resin layer.

More specifically, as the above surface resin layer, there is used a fluororesin film such as a tetrafluoroethylene-ethylene copolymer film or a polyvinyl fluoride film. The above mentioned filler is interposed between the surface resin layer and the solar cell. As the filler, there is used a resin such as EVA (ethylene-vinyl acetate copolymer) or butyral resin. A back face film is provided on the back face of the above conductive substrate of the solar cell by way of the filler. As the back face film, there is used a nylon film, an aluminum laminated Tedlar film, or the like. In addition, the practical solar cell module has a supporting member provided under the back face film by way of the filler.

Accordingly, with respect to the filler interposed between the surface resin layer and the photovoltaic element, the filler interposed between the conductive substrate and the back face film, and the filler interposed between the back face film and the supporting member, each of them requires an adhesive function, and a function of protecting the outside of the photovoltaic element in terms of scratch and impact resistance.

However, when used in the outdoors for a long period of time (for example, 20 years), the prior art solar cell module having the above coating material composed of the surface resin layer and the filler presents the following disadvantage: namely, unsaturated double bonds are present in the main chain of the filler resin and they are conjugated; consequently, the solar cell module exhibits light absorption in the ultraviolet region or in the visible region having a wave length longer than that of the ultraviolet region. In other words, the prior art solar cell module has a disadvantage particularly in terms of weather resistance.

To solve the above-described disadvantage of the prior art solar cell module, Unexamined Japanese Patent No. SHO 58-60579 (hereinafter, referred to as "reference 1") has proposed a technique in which an ethylene series copolymer resin containing a coupling agent and an organic peroxide is used as the resin for the filler of the coating material of the solar cell module. According to the description of the reference 1, as the ethylene series copolymer resin, there may be used ethylene-vinyl acetate copolymer (hereinafter, in some cases, referred to as "EVA") containing vinyl acetate in an amount of about 40 wt % or less, preferably, of from 20 to 40 wt %. Reference 1 further describes that the above EVA is excellent is adhesion to a white glass board or polyvinyl fluoride sheet, and in flexibility.

However, to improve the weather resistance of the above EVA, only an ultraviolet ray absorber or hindered amine is added thereto, and accordingly, even the solar cell module using the improved EVA cannot be expected to have good weather resistance over a long period of time (for example, 20 years). The EVA also presents another disadvantage in that it easily yellows resulting in decreased light transmittance, thereby reducing the conversion efficiency of the solar cell module.

This becomes conspicuous when the solar cell module is used at a high temperature, for example, in the case of a module integrated with a roof member. Namely, it is known that the filler composed of EVA is more likely to experience yellowing at a module temperature of 80° C. or more. In general, the EVA used for the solar cell module contains stabilizer additives, including an ultraviolet ray absorber, a light stabilizer, and an oxidation inhibitor; however, these additives tend to be volatilized within 10 years or to be bled-out or decomposed.

As a resin for the filler of the coating material of the solar cell module, butyral resin different from the above-described resin has been known. The butyral resin is relatively good in weather resistance; however, it is relatively high in hygroscopicity, which causes a problem that when a solar cell in the module has a damaged portion, moisture is easier to permeate into the module through the damaged portion. Specifically, there often occurs a phenomenon wherein, due to the effect of the moisture thus permeated and the electric field of the solar cell, metal constituting a collecting electrode is repeatedly ionized and precipitated, and it grows in the damaged portion. The progress of this phenomenon (reaction) leads to a problem in producing short-circuits in the solar cell or obstructing the effective collection of separated charges, resulting in reduced conversion efficiency. The butyral resin also exhibits irreversible devitrification which significantly reduces transparency (transparency is not returned even by drying), which is a critical defect for the solar cell module.

Other than the above resins, fluororesin has been proposed for the filler of the coating material of the solar cell module. For example, Examined Japanese Patent No. HEI 4-76229 (hereinafter, referred to as "reference 2") describes a construction in which a CdS/CdTe type solar cell module is provided with a protective film composed of a derivative of a resin containing a perfluoroalkylene group and active hydrogen. In reference 2, as the resin containing a perfluoroalkylene group and active hydrogen, there is proposed a resin product (trade name: Lumiflon) produced by Asahi Glass Co., Ltd. According to the description of reference 2, the resin product is a fluorine-containing polymer which has a perfluoroalkylene group and pendant active hydrogen, more specifically, an OH group, and which generally has a number-average molecular weight in the range of 20,000 to 80,000. This reacts with a compound having a melamine group or isocyanate group to produce the derivative (cross-linked polymer) of the above resin. Reference 2 further describes that the above LUMIFRON is cross-linked by isocyanate or resol type phenol resin, to obtain a protective film having excellent moisture resistance.

Incidentally, in the coating technique using the above cross-linked resin, described in reference 2, the protective film is required to be positioned on the outermost surface of the solar cell module.

Specifically, the pot life of the resin after the above cross-linking agent is added is generally short, and actually, the pot life is prolonged by protecting the isocyanate by adding a blocking agent.

However, as described above, in the case of adopting a coating material structure in which the surface resin layer is laminated on a specified resin, dissociation and volatilization of the blocking agent upon cross-linking of the resin is suppressed by the presence of the surface resin layer, which obstructs the progress of the cross-linking reaction. Even when the above resin is cross-linked before the surface resin layer is laminated thereon for accelerating the dissociation and volatilization of the blocking agent, the cross-linked resin is poor in stickiness and adhesiveness, and thereby the lamination is difficult to be performed. In the case of using melamine as the cross-linking agent, no effective blocking agent is known; consequently, such a cross-linked resin is required to be used on the outermost surface of the solar cell module. Incidentally, the surface hardness of the above cross-linked resin is generally as low as about B to H in pencil hardness. The cross-linked resin having such a surface hardness is easily damaged by contact with sand, dust, and the like present outdoors, and collects contamination and refuse in the damaged portions, thereby being shielded from the sunshine. As for the lamination of the cross-linked resin, while being affected by the laminating manner, only the coating of a paint presents a problem of generating pin holes and the entrapment of refuse thereby causing moisture or oxygen to easily permeate the photovoltaic element (solar cell). In view of the foregoing, there has been not found a filler made of organic material used for a coating material capable of maintaining the solar cell module at a high level of weather resistance and moisture resistance.

Incidentally, coating material constituted of glass has been considered to be most desirable for solving the problem in terms of yellowing and hygroscopicity of the material, and a technique has been proposed in which the solar cell is encapsulated with glass. This technique, however, has a problem that the coating using glass is poor in flexibility, impact resistance, high in weight, and cost reduction; accordingly, it is undesirable for a solar cell having a large area which is used outdoors.

SUMMARY OF THE INVENTION

The present inventors have earnestly studied the above-described problems of the prior art solar cell modules, and accomplished the present invention.

Specifically, the present inventors have examined the above-described problems of the prior art solar cell modules through various experiments, and have determined that the above-described problems can be solved by use of a composition containing a vinylidene fluoride copolymer and an acrylic resin as the filler of a coating material. On the basis of this knowledge, the present invention has been accomplished.

An object of the present invention is to provide a solar cell module having excellent weather resistance, heat resistance, adhesion to a photovoltaic element (solar cell), and scratch resistance; being capable of minimizing the deterioration in the performance of the solar cell due to moisture permeation; and achieving a desirable photoelectric conversion efficiency over a long period of time.

In the solar cell module of the present invention, at least the light receiving surface side of a photovoltaic element (solar cell) is coated with a filler, and the filler is made of a composition containing a vinylidene fluoride copolymer and an acrylic resin.

BEST MODE FOR CARRYING OUT THE INVENTION

Figure 1:
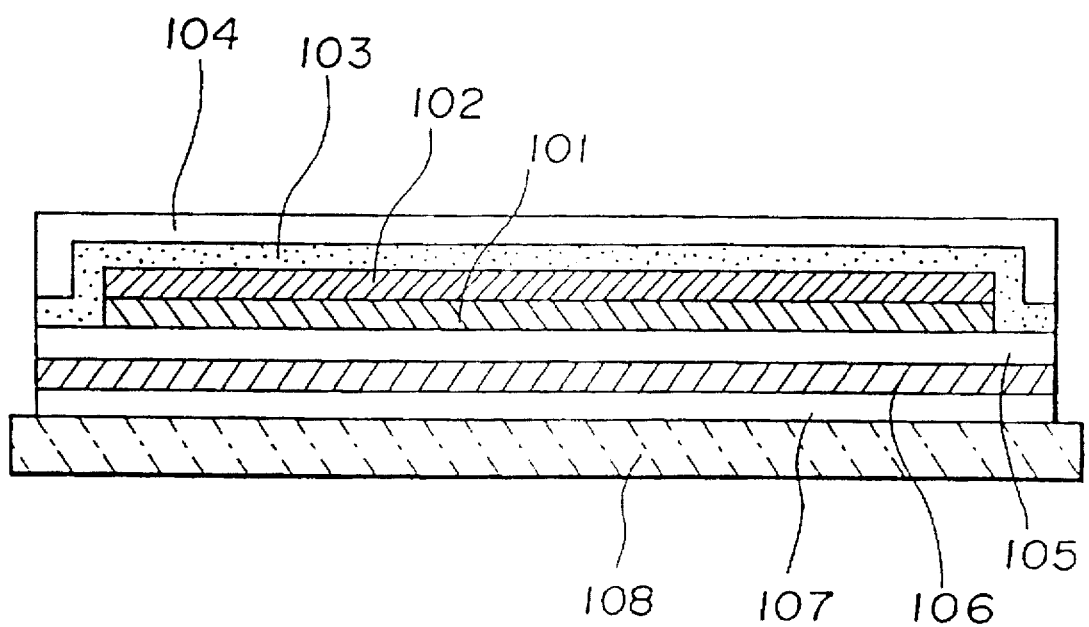
FIG. 1 is a schematic sectional view of an example of a solar cell module according to the present invention.

FIG. 1 is a schematic view showing the construction of a solar cell module of the present invention. In FIG. 1, reference numeral 101 is a conductive substrate; 102 is a photovoltaic element (solar cell); 103 is a filler; and 104 is a surface resin layer. Reference numerals 105, 107 are fillers on the back face; 106 is a back face film; and 108 is a supporting member. Light from the exterior enters from the outermost surface resin 104, and reaches the photovoltaic element (solar cell) 102. The photovoltaic current is supplied to the outside by way of output terminals (not shown). The filler 103 for coating the light receiving side of the photovoltaic element 102, which is the essential portion of the present invention, will be described in detail. The filler 103 is required to cover the irregularities of the surface of the photovoltaic element 102 and to ensure the adhesive strength between the photovoltaic element 102 and the surface resin layer 104. Accordingly, the filler requires weather resistance, heat resistance, and moisture resistance over a long period of time, and further it requires thermoplasticity and adhesiveness upon thermo-compression bonding. In the case of a flexible module using a photovoltaic element having a high flexibility, the filler requires a high breaking elongation.

The present inventors have carried out a number of experiments, and have found that a specified composition selectively containing a vinylidine fluoride copolymer and an acrylic resin is most suitable for a filler 103 capable of satisfying the above requirements.

The filler 103 can be formed in a desirable shape by a known method. Examples of this method include: (i) a process of heating and melting a composition containing a vinylidine fluoride copolymer and an acrylic resin in a sealable vessel, and cooling and hardening the composition on the photovoltaic element 102; (ii) a process of dissolving a composition containing a vinylidence fluoride copolymer and an acrylic resin in a solvent such as acetone, tetrahydrofuran, methyl ethyl ketone, dimethyl formamide, dimethyl acetoamide, tetramethylurea, and trimethylphosphate, coating the surface of the photovoltaic element 102 with the solution thus obtained, and hardening the composition containing the vinylidine fluoride copolymer and acrylic resin; and (iii) a process of uniformly coating the whole surface of the photovoltaic element 102 with a powder mixture of the vinylidence fluoride copolymer and an acrylic resin using an electrostatic powder coater of corona charging type or frictional charging type, and melting and fusing the coated powder mixture and hardening it. In the process (iii), the average particle size of the powder is preferably in the range of from 5 to 50 μm. Of these processes, (iii) is effective for a photovoltaic element having a large area. In the composition of the filler 103 containing vinylidene fluoride copolymer and acrylic resin, the mixing ratio (by weight) between the vinylidene fluoride copolymer and the acrylic resin is preferably in the range of from 1/9 to 4/6. The composition having the above mixing ratio can form a filler excellent in breaking elongation.

When the mixing ratio is less than 1/9, the vinylidene fluoride copolymer cannot be expected to be good in terms of weather resistance, or the acrylic resin becomes poor in flexibility. On the other hand, when the mixing ratio is more than 4/6, the composition is sufficient in weather resistance; however, it requires a temperature of 200° C. or more upon thermo-compression bonding, and has a problem that an organic resin used for a collecting electrode is excessively cross-linked or deteriorated by oxidation. In this case, although exhibiting thermoplasticity, the composition is insufficient in adhesion to the photovoltaic element or surface resin layer.

Additionally, in the case where a plurality of photovoltaic elements are electrically connected to each other by a low melting metal or the like, there often occurs a problem that the electric resistance is increased at the temperature (200° C. or more) of the thermo-compression bonding.

The vinylidene fluoride monomer of the vinylidene fluoride copolymer used in the present invention is limited to a type capable of being copolymerized with extremely high polarity. In other words, the vinylidene fluoride copolymer used in the present invention mainly contains polyvinylidene fluoride, and it is obtained by polymerization of the polyvinylidene fluoride with hexafluoropropylene. It may also be obtained by polymerization of polyvinylidene fluoride with tetrafluoroethylene. In this case, the copolymer thus obtained exhibits a high strength. Other than these monomers capable of being copolymerized, there may be used fluoroalkylvinylether and hexafluoroisobutylene. To impart both high strength and flexibility, it is desirable to blend a graft copolymerization obtained vinyl monomer having functions of chlorotrifluoroethylene and peroxide with the polyvinylidene fluoride copolymer. The molecular weight of the polyvinylidene fluoride copolymer may be in the range of 1 to 500,000. In one of the methods of manufacturing the solar cell module of the present invention, the copolymer is dissolved in solvent and then formed into a film or it is applied and dried on a photovoltaic element, to thus immediately form a filler. It is desirable to perform ternary-copolymerization between polyvinylidene fluoride, hexafluoropropylene, and tetrafluoroethylene for increasing the solubility against the solvent.

In the case where the filler is obtained by forming a film using a specified solution or by coating and drying the solution, polyvinylidene fluoride, hexafluoropropylene, and tetrafluoroethylene may be ternary-copolymerized. In this case, the solution is improved in solubility, and thus it can form a desirable filler.

The acrylic resin used for forming the filler 103 of the present invention will now be described. The acrylic resin is not particularly limited, but is preferably excellent in weather resistance. Specific examples of main monomers constituting the acrylic resin include methyl (meta) acrylate, ethyl (meta) acrylate, 2-propyl (meta) acrylate, and n-propyl (meta) acrylate. In the case where the filler 103 requires flexibility, the above monomers can be copolymerized with butyl (meta) acrylate, 2-ethyl hexyl (meta) acrylate, or the like. To reduce the hygroscopicity of the acrylic resin, the above monomers can be copolymerized with styrene. The molecular weight of such an acrylic resin is preferably in the range of from 20,000 to 500,000.

The filler 103 preferably has an acid component for increasing adhesion to both the photovoltaic element 102 and the surface resin layer 104. In terms of acid value, it is preferably in the range of from 5 to 50. Here, the "acid value" is the amount of free acid in a resin or the like, and it is represented by mg of potassium hydroxide required for neutralizing the free acid contained in a sample in an amount of 1 g. When the acid value is less than 5, the effect of the acid component contained in the filler is poor. On the other hand, when it is more than 50, the above adhesion is sufficiently expected; however, the hygroscopicity degree is increased and the reliability of the photovoltaic element 102 is reduced. In this case, there occurs a problem that the transparent conductive layer 204 (See FIG. 2) is etched by the acid component. To introduce the acid component in the filler 103, the following methods may be used: copolymerizing a monomer containing acid with the acrylic resin which is a secondary component of the filler 103; and adding a resin containing acid as a third component to the filler 103.

In the former method, a monomer containing acid is copolymerized with the acrylic resin as the second component of the filler. Specifically, the monomer of the acrylic resin is copolymerized with (meta) acrylic acid or with maleic anhydride and phthalic anhydride, followed by ring-opening using water. In the latter method, the resin as the third component is added with the acrylic resin as the second component. Specific examples of the third component resin include a ring-opened styrene- maleic anhydride copolymer or ring-opened isobutylene- maleic anhydride copolymer. Moreover, there may be used a resin in which (meta) acrylic acid is block- or graft- copolymerized therewith.

The block or graft copolymer is superior to the random copolymer in the adhesion of the filler 103 to the surface resin layer 104 or photovoltaic element 102.

The cross-linking of the filler 103 will be described below. From the viewpoint of the operational environment of a solar cell module, it is desirable to cross-link the filler 103. Specifically, in the solar cell module, the filler 103 is required to be strongly bonded with the photovoltaic element 102 and the surface resin layer 104 at a high temperature over a long period of time. The filler 103 is preferably cross-linked for preventing the softening thereof by the heat of the sun of the separation thereof from the end portion of the module.

The cross-linking of the filler 103 is generally performed by way of isocyanate, melamine, or organic peroxide. A cross-linking agent used in the present invention must be sufficiently long in pot life and speedy in the cross-linking reaction. Furthermore, the cross-linking agent is preferably of a type capable of eliminating or minimizing matter to be separated therefrom when the surface resin layer 104 is laminated on the filler 103. As a cross-linking agent capable of satisfying such requirements, there may be used organic peroxide. The function of the organic peroxide will be described below. The cross-linking by the organic peroxide is performed by a method wherein free radicals generated from the organic peroxide extract hydrogen from the resin and thus form C—C bonds. As is well-known, the activation of the organic oxide is performed by thermal decomposition, redox decomposition, or ion decomposition, of which the thermal decomposition is most preferable. As the organic peroxide, there may be used a hydroperoxide series, dialkyl (allyl) peroxide series, diacyl peroxide series, peroxyketal series, peroxyester series, peroxycarbonate series, or ketone peroxide series.

The specific examples of the hydroperoxide series include: t-butyl peroxide; 1,1,3,3-tetramethylbutyl peroxide; p-menthane hydroperoxide; cumene hydroperoxide; p-thymene hydroperoxide; diisopropylbenzene peroxide; 2,5-dimethylhexane-2,5-dihydroperoxide; cyclohexane peroxide; and 3,3,5-trimethylhexanone peroxide.

The specific examples of the dialkyl (allyl) peroxide include: di-t-butyl peroxide; dicumyl peroxide; and t-butylcumyl peroxide.

The specific examples of the diacyl peroxide series include: diacetyl peroxide; dipropionyl peroxide; diisobutyryl peroxide; dioctanoyl peroxide; didecanoyl peroxide; dilauroyl peroxide; bis (3,3,5-trimethyhexanoyl) peroxide; benzoyl peroxide; m-toluic peroxide; p-chlorobenzoyl peroxide; 2-4-dichlorobenzoyl peroxide; and peroxysuccinic acid.

The specific examples of the peroxyketal series include: 2-2-di-t-butyl peroxybutane; 1-1-di-t-butylperoxycyclohexane; 1-1-di-(t-butylperoxy)-3,3,5-trimethylcyclohexane; 2,5-dimethyl-2,5-di (t-butylperoxy) hexane; 2,5-dimethyl-2,5-di (t-butylperoxy) hexyne-3; 1-3-di (t-butylperoxyisopropyl) benzene; 2,5-dimethyl-2,5-dibenzoylperoxyhexane; 2,5-dimethyl-2,5-di (peroxyzenzoyl) hexyne-3; n-butyl-4,4-bis (t-butylperoxy) valerate.

The specific examples of the peroxyester series include: t-butylperoxyacetate; t-butylperoxyisobutylate; t-butylperoxypivalate; t-butylperoxyneodecanoate; t-butylperoxy-3,3,5-trimethylhexanoate; t-butylperoxy-2-etylhexanoate; (1,1,3,3-tetramethybutylperoxy)-2-ethyhexanoate; t-butylperoxylaurate; t-butylperoxybezoate; di (t-butylperoxy) adipate; 2,5-dimethyl-2,5-di (peroxy-2-ethylhexanoyl) hexane; di (t-butylperoxy) isophthalate; t-butylperoxymaleate; and acetylcyclohexylsulfonyl peroxide.

The specific examples of the peroxycarbonate series include: t-butylperoxyisopropyl carbonate; di-n-propylperoxy dicarbonate; di-sec-butylperoxy dicarbonate; di (isopropylperoxy) dicarbonate; di (2-ethylhexylperoxy) dicarbonate; di (2-ethoxyethylperoxy) dicarbonate; di (methoxyisopropylperoxy) dicarbonate; di (3-methoxybutylperoxy) dicarbonate; and bis-(4-t-butylcyclohexylperoxy) dicarbonate.

The specific examples of the ketone peroxide series include; acetylacetone peroxide; methyethylketone peroxide; methyisobutylketone peroxide; and ketone peroxide. In addition, vinyltris (t-butylperoxy) silane may be used.

The added amount of the above-described organic peroxide is preferably in the range of 0.1 to 5% relative to the amount of the filler 103. The organic peroxide is mixed with the filler 103, and the mixture is hot-pressed, which is accompanied by the cross-linking and the thermocompression bonding of the solar cell module. The heating temperature and the heating time in the above hot-pressing can be determined depending on the thermal decomposition temperature characteristic of each organic peroxide. In general, the heating is performed by selecting the heating temperature and the heating time such that the thermal composition progresses by 90%, preferably, 95% or more. The pressing is performed by use of a hot-roll or hot-press. Alternatively, the pressure inside the system is reduced using an air bag-like jig and the pressing is performed by the atmospheric pressure.

To make the above cross-linking reaction effective, there may be used triallylcyanurate as a cross-linking agent. The added amount thereof is preferably in the range of 0.1 to 5% relative to the amount of the filler 103.

To further enhance the adhesive force of the filler 103 to the photovoltaic element 102 or the surface resin layer 104, a silane coupling agent may be added to the filler 103. The specific examples of the silane coupling agent include: vinyltrichlorsilane; vinyltris (β-methoxyethoxy) silane; vinyltriethoxysilane; vinyltrimethoxysilane; γ-methacryloxypropyltrimethoxysilane; β-(3,4-epoxycyclohexyl) ethytrimethoxysilane; γ-glycidoxypropylmethyldiethoxysilane; N-β (aminoethyl) γ-aminopropyltrimethoxysilane; N-β (aminoethyl) γ-aminopropylmethyldimethoxysilane; γ-aminopropyltriethoxysilane; N-phenyl-γ-aminopropyltrimethoxysilane; γ-mercaptopropyltrimethoxysilane; and γ-cloropropyltrimethoxysilane.

The added amount of the silane coupling agent is preferably in the range of from 0.1 to 5% relative to the amount of the filler 103. When it is less than 0.01%, the effect of the silane coupling agent cannot be expected. When it is more than 5%, the effect is saturated, and the mechanical strength of the filler 103 is possible reduced because of the increased amount of low molecular component.

The material of the filler 103 used in the present invention is excellent in weather resistance; however, to further improve the weather resistance, or to protect the lower layer of the filler 103, an ultraviolet ray absorber may be added to the filler 103. As the ultraviolet ray absorber, there may be used the known salicylate series, benzophenone series, benzotriazole series, and cyanoacrylate series.

Specific examples of the salicylate series include: phenylsalicylate; p-tert-butylphenylsalicylate; and p-octylphenylsalicylate.

Specific samples of the benzophenone series include: 2-4-dihydroxybenzophenone; 2-hydroxy-4-methoxybenzophenone; 2-hydroxy-4-octoxybenzophenone; 2-hydroxy-4-dodecyloxybenxophenone; 2-2'-dihydroxy-4-methoxybenzophenone; 2,2'-dihydoxy-4,4'-dimethoxybenzophenone; 2-hydroxy-4-methoxy-5-sulfobenzophenone; and bis (2-methoxy-4-hydroxy-5-benzophenone).

The specific examples of the benzotriazole series include: 2-(2'-hydroxy-5'-methylphenyl) benzotriazole; 2-(2'-hydroxy-5'-tert-butylphenyl) benzotriazole; 2-(2'-hydroxy-3',5'-di-tert-butylphenyl) benzotriazole; 2-(2'-hydroxy-3'-tert-butyl-5-methylphenyl)-5-chlorobenzotriazole; 2-(2'-hydroxy-3',5'-di-tert-butylphenyl)-5-chlorobenzotriazole; 2-(2'-hydroxy-3',5'-di-tert-amylphenyl) benzotriazole; 2-{2'-hydroxy-3'-(3",4",5",6"-tetrahydrophthalimidemethyl)-5'-methylphenyl} benzotriazole; and 2,2-methylenebis {4-(1,1,3,3-tetramethylbutyl)-6-(2H-benzotriazole-2-il) phenol}.

Specific examples of the cyanoacrylate series include: 2-ethylhexyl-2-cyano-3,3'-diphenylacrylate; and ethyl-2-cyano-3,3'-diphenylacrylate. One kind or more of the above ultraviolet ray absorbents may be added.

To enhance weather resistance, a hindered amine series photo-stabilizer may be used, other than the above ultraviolet absorber. Differently from the ultraviolet ray absorber, the hindered amine series photo-stabilizer does not absorb ultraviolet rays, but it exhibits a significant synergistic effect in combination with the ultraviolet ray absorber. Of course, other photo-stabilizers besides the hindered amine series are known to act as the photo-stabilizer; however, they are often colored and thus not desirable for the filler 103 of the present invention. Specific examples of the hindered amine series photo-stabilizer include: succinodimethyl-1-(2-hydroxyethyl)-4-hydroxy-2,2,6,6-tetramethylpiperidine polycondensation; poly [{6-(1,1,3,3-tetramethylbutyl) amino-1,3,5-triazine-2,4-diil} {(2,2,6,6,-tetramethyl-4-piperidyl) imino} hexamethylene {(2,2,6,6,-tetramethyl-4-piperidyl) imino}]; N,N'-bis (3-aminopropyl) ethylenediamine-2,4-bis [N-butyl-N-(1,2,2,6,6-pentamethyl-4-piperidyl) amino]-6-cloro-1,3,5-triazine condensation; bis (2,2,6,6-tetramethyl-4-piperidyl) sebacate; and 2-(3,5-di-tert-4-hydroxybenzil)-2-n-butylmalonic bis (1,2,2,6,6,-pentamethyl-4-piperidyl).

In general, the fluororesin seems to be slightly poor in heat resistance as compared with the weather resistance; accordingly an oxidation inhibitor is preferably added. As the oxidation inhibitor, there may be used a monophenol series, bisphenol series, high molecular phenol series, sulfur series, or phosphoric acid series.

Specific examples of the monophenol series include: 2,6-di-tert-butyl-p-cresol; butylic hydroxyanisole; and 2,6-di-tert-butyl-4-ethylphenol.

Specific examples of the bisphenol series include: 2,2'-methylene-bis-(4-methyl-6-tert-butylphenol); 2,2'-methylene-bis-(4-methyl-6-tert-butylphenol); 4,4'-thiobis-(3-methyl-6-tert-butylphenol); 4,4'-butylidene-bis-(3-methyl-6-tert-butylphenol); 3,9-bis[{1,1-dimetyl-2-{β-(3-tert-butyl-4-hydroxy-5-metylphenyl) propionyloxy} ethyl-2,4,8,10-tetraoxaspiro]-5,5-undecane.

Specific examples of the high molecular phenol series include: 1,1,3-tris-(2-methyl-4-hydroxy-5-tertbutylphenyl) butane; 1,3,5-trimethyl-2,4,6-tris (3,5-di-tert-butyl-4-hydoxybenzil) benzene; tetrakis{methylene-3-(3',5'-di-tert-butyl-4'-hydroxyphenyl) propionate} methane; bis {(3,3'-bis-4'-hydroxy-3'-tert-butylphenyl) butylic acid} glycolester; 1,3,5-tris (3',5'-di-tert-butyl-4'-hydroxybenzil)-s-triazine-2, 4,6-(1H,3H,5H) trione; and triphenol (vitamin E).

Specific examples of the sulfur series include: dilaurylthiopropionate; dimyristylthiodipropionate; and distearylthiopropionate.

Specific examples of the phosphoric acid series include: triphenylphosphite; diphenylisodecylphosphite; phenyldiisodecylphosphite; 4-4'-butylidene-bis-(3-methyl-6-tert-butylphenyl-di-tridecyl) phosphite; cyclicneopentanetetrailbis (octadecylphosphite); tris (mono and/or di) phenylphosphite; diisodecylpentaerythritoldiphosphite; 9-10-dihydro-9-oxa-10-phosphaphenanthrene-10-oxide; 10-(3,5-di-tert-butyl-4-hydroxybenzil)-9,10-dihydro-9-oxa-10-phosphaphenanthrene-10-oxide; 10-desiloxy-9,10-dihydro-9-oxa-10-phosphaphenanthrene; cyclicneopentanetetrailbis (2,4-di-tert-butylphenyl) phosphite; cyclicneopentanetetrailbis (2,6-di-tertmethylphenyl) phosphite; 2,2-methylenebis (4,6-tertbutylphenyl) octylphosphite.

From the viewpoint of the operational environment of the solar cell module, it is desirable to use the ultraviolet ray absorber, photo-stabilizer, and oxidation inhibitor, each of which is low in volatility.

The surface resin layer 104 used in the present invention will be described below. Since it is positioned on the outermost layer of the solar cell module, the surface resin layer 104 is required to ensure the long-term reliability of the solar cell module during exposure in the outdoors, as well as weather resistance, water repellency, contamination resistance, and mechanical strength.

The material of the surface resin layer 104 of the present invention preferably contains fluorine in an amount of 38 to 60%. The specific examples of the material include cinylidene fluoride copolymer and tetrafluorethylene-ethylene copolymer. The homopolymer, polyvinylidene fluoride contains fluorine in an amount of 56%, and to adjust surface hardness, flexibility, transparency and cost, acrylic resin may be added thereto. The mixing ratio (in weight) between vinylidene fluoride copolymer and acrylic resin is preferably in the range of from 10/0 to 7/3. When it is less than 7/3, the surface resin layer 104 is difficult to satisfy the expected weather resistance. When it is 7/3, the content of fluorine becomes about 39%. In the case of using tetrafluoroethylene-ethylene copolymer, which is a ternary copolymer, the content of fluorine becomes 56%. Tetrafluorethylene-ethylene copolymer exhibits embrittlement in a specified high temperature region. To solve such a problem, vinyl ether or vinyl ester monomer as a third component may be copolymerized. Vinylidene fluoride copolymer is superior to tetrafluoroethylene-ethylene copolymer in weather resistance. In view of both weather resistance and mechanical strength, tetrafluoroethylene-ethylene copolymer is superior to vinylidene fluoride copolymer.

To improve adhesion between the filler 103 and the surface resin layer 104, the surface resin layer 104 is preferably subjected to corona treatment or plasma treatment.

The solar cell module of the present invention is generally used being fixed on a roof or the like. In this case, the solar cell module is often folded at its end portion. Upon folding of the solar cell module, the surface resin layer is also extended, and in some cases it causes breaking or cracking at the folded portion of the surface resin layer. To prevent this problem, it is desirable not to orient the tetrafluoroethylene-ethylene copolymer.

The feature of a uniaxial-orientated film lies in that, in the orientated direction, it is lower in breaking elongation, higher in breaking strength, and lower in hygroscopicity, than in the non-oriented direction and in a non-orientated film. However, when being folded, the uniaxial-oriented film experiences breaking or cracking at the folded portion. To prevent such a failure due to the folding, the uniaxial-oriented film is required to be folded at a large curvature or to be folded while being heated, thus requiring a lot of labor. This complicated operation can be eliminated by use of a non-oriented film.

The photovoltaic element 102 (solar cell) used in the solar cell module of the present invention will now be described. The photovoltaic element 102 is formed of a semiconductor photoactive layer as a photoelectric conversion member on the conductive substrate 101.

Figure 2:
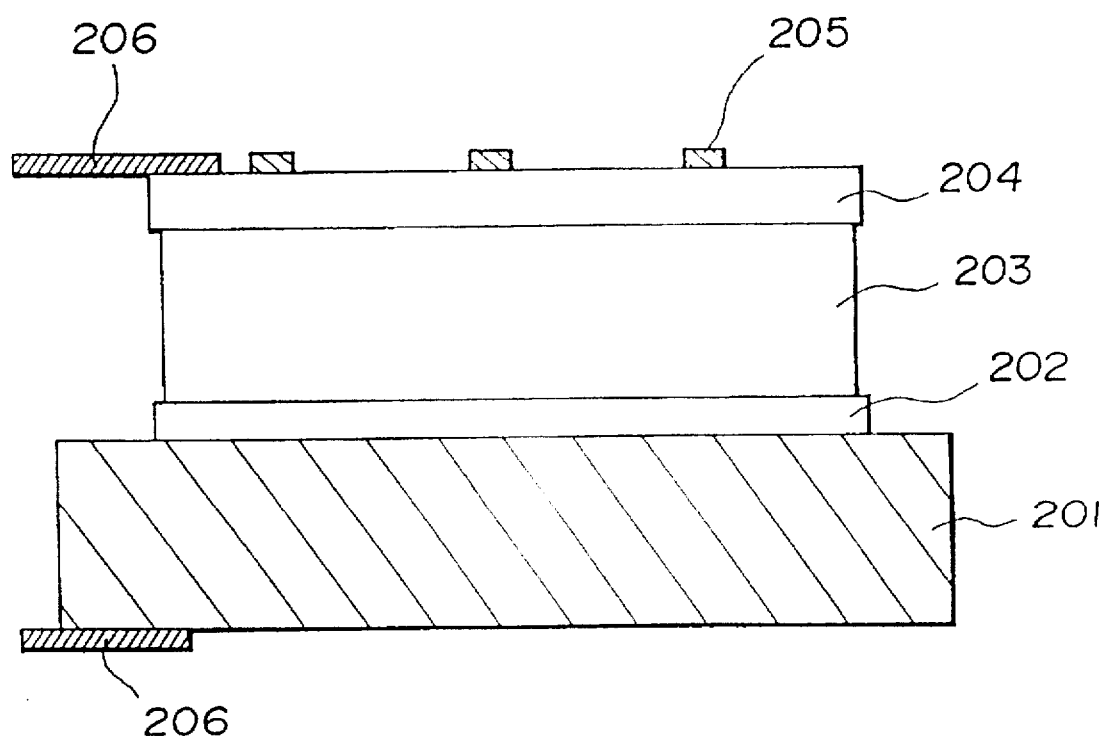
FIG. 2 is a schematic sectional view showing the basic construction of a photovoltaic element (solar cell) used in the solar cell module shown in FIG. 1.

FIG. 2 shows the schematic construction of the photovoltaic element (solar cell). In FIG. 2, reference numeral 201 is a conductive substrate; 202 is a back face reflection layer; 203 is a semiconductor photoactive layer; 204 is a transparent conductive layer; 205 is a collecting electrode; and 206 is an output terminal. The conductive substrate 201 functions as the base of the photovoltaic element and also as the lower electrode. Specific examples of the material of the conductive substrate 201 include silicon, tantalum, molybdenum, tungsten, stainless steel, aluminum, copper, titanium, a carbon sheet, lead plated steel sheet, and a resin film or ceramics formed with a conductive layer.

The back face reflection layer 202 on the conductive substrate 201 may be formed of a metal layer, a metal oxide layer, or a laminated structure of a metal layer and a metal oxide layer. The metal layer can be formed of Ti, Cr, Mo, W, Al, Ag, or Ni. The metal oxide layer can be formed of ZnO, $TiO_2$, or $SnO_2$. The metal layer and the metal oxide layer can be formed by resistance heating deposition, electron beam deposition, or sputtering.

The back face reflection layer 202 may have a surface with irregularities. In this case, the light absorption is increased at the semiconductor photoactive layer. The back face reflection layer having such a surface with irregularities can be formed by a method, for example, wherein ZnO is irregularly formed on an Ag layer having a smooth surface.

The semiconductor photoactive layer 203 is intended to perform photoelectric conversion. The semiconductor photoactive layer may be formed of a single crystal silicon semiconductor, a non-single crystal silicon semiconductor (for example, an amorphous silicon semiconductor or a polycrystalline silicon semiconductor), and a compound semiconductor (for example, $CuInSe_2$, $CuInS_2$, GaAs, CdS/$Cu_2$S,CdS/CdTe, CdS/InP, or CdTe/$Cu_2$Te). The semiconductor photoactive layer formed of either of the above semiconductors has a laminated structure with a pn junction, pin junction, or Schottky junction.

The above semiconductor photoactive layer can be formed by the known film forming method. For example, the semiconductor photoactive layer composed of an amorphous silicon semiconductor can be formed by the known RF plasma CVD or microwave plasma CVD methods using a suitable source gas such as silane gas. In the case of forming a polycrystalline semiconductor layer, it can be formed by a method of preparing molten silicon or molten silicon-germanium and forming a film thereof; or preparing amorphous silicon material or amorphous silicon-germanium and forming a film thereof by heat-treatment.

In the case where the semiconductor photoactive layer is formed of the above-described compound semiconductor, it can be formed by known ion plating, electron beam deposition, vacuum deposition, sputtering, or electrolytic deposition methods.

The transparent conductive layer 204 serves as the upper electrode of the solar cell. In the case where the sheet resistance of the semiconductor photoactive layer is sufficiently low, the transparent conductive layer is not required to be provided. Specific examples of the material of the transparent conductive layer 204 include $In_2O_3$, $SnO_2$, $In_2O_3$-$SnO_3$-$SnO_2$ (ITO), ZnO, $TiO_2$, $Cd_2SnO_4$, and a crystalline semiconductor highly doped with impurities. The transparent conductive layer can be formed by resistance heating deposition, sputtering, spraying, CVD, or impurity diffusion. The transparent conductive layer 204 preferably has a film thickness capable of achieving an antireflection function. In general, the film thickness thereof is preferably in the range of from 50 to 300 nm.

A grid-like collecting electrode (grid) 205 is preferably provided on the transparent conductive layer 204 for effectively collecting the current. Specific examples of the material of the collecting electrode 205 include Ti, Cr, Mo, W, Al, Ag, Ni, Cu, Sn; or a conductive member which is typically formed of silver paste or carbon paste. The collecting electrode can be formed by a method employing sputtering, resistance heating, or CVD using a mask pattern; depositing a metal film over the surface and etching the unnecessary portion for patterning; directly forming a grid electrode pattern by photo-CVD; forming a patterned negative mask to a grid electrode pattern, followed by plating; or printing conductive paste. The conductive paste is usually of a type in which fine powdery silver, gold, nickel, or carbon is dispersed in a binder resin. Specific examples of the binder resin include polyester resin, epoxy resin, acrylic resin, alkyd resin, polyvinylacetate resin, rubber, urethane resin, and phenol resin. Other than this, a wire made of a metal such as Cu may be provided on the transparent conductive layer 204.

The output terminals 206 are intended to supply the photovoltaic current. They are attached to the conductive substrate 201 and the collecting electrode 205, respectively. A metal piece such as a copper tab may be connected to the conductive substrate 201 by spot welding or soldering. On the other hand, a metal may be electrically connected to the collecting electrode 205 by means of conductive paste or solder.

A plurality of the photovoltaic elements (solar cells) 102 may be provided. In this case, the photovoltaic elements are connected in series or in parallel according to the desired voltage or current. The photovoltaic elements can be integrated on an insulated substrate, to thus obtain a desired voltage or current.

The back face film 106 is used for maintaining electric insulation between the conductive substrate 101 of the photovoltaic element 102 and the exterior. The back face film is preferably made of a flexible material which ensures sufficient electric insulation with the conductive substrate 101 of the photovoltaic element, being excellent in long-term durability, and withstands heat expansion and heat contraction. As the material, there may be used nylon and polyethylene terephthalate. The thickness of the back face film 106 is usually in the range of from 10 to 500 µm.

The back face fillers 105, 107 are intended to improve adhesion to the conductive substrate 101, back face film 106, and reinforcing plate 108. The fillers 105, 107 are preferably made of a flexible material which ensures sufficient adhesion with the above components, being excellent in long-term durability, and withstands heat expansion and heat contraction. Preferred examples of the material include a hot melt material such as EVA or butyral resin, adhesive double coated tape, and epoxy based adhesive having flexibility. In a solar cell module used at a high temperature environment, for example, in a type integrated with a roof material, the back face filler is preferably cross-linked for ensuring the adhesion at the high temperature environment. In the case where EVA is used for the back face filler, it may be cross-linked using organic peroxide. The thickness of the back face filler is preferably in the range of from 150 µm to 2 mm.

On the outside of the back face coating film 106, a reinforcing material 108 may be adhered for reinforcing the mechanical strength of the solar cell module or preventing deformation and camber due to temperature change. As the reinforcing material, there may be used a steel plate, coated steel plate, plastic plate, and FRP (glass fiber reinforced plastic).

Hereinafter, the present invention will be more fully described by way of the following examples, which are not intended to restrict the scope of the present invention. In addition, in the following description, the term "parts" means "parts by weight".

EXAMPLE 1

In this example, a solar cell module having the construction shown in FIG. 1 was prepared. First, a photovoltaic element (solar cell) having the construction shown in FIG. 2 was prepared as follows. An Al layer (film thickness: 5000 Å) and ZnO layer (film thickness: 5000 Å) as a back face reflection layer 202, were sequentially formed on a cleaned stainless steel substrate 201 by sputtering. Subsequently, an n-type a-Si layer (source gas: mixed gas of $SiH_4$, $PH_3$, and $H_2$), i-type a-Si layer (source gas: mixed gas of $SiH_4$ and $H_2$) and p-type microcrystal µc-Si layer (source gas: mixed gas of $SiH_4$, $BF_3$, and $H_2$) were formed by plasma CVD, to thus obtain a tandem type a-Si photoelectric conversion semiconductor layer 203 having a layer construction of n-layer (film thickness: 150 Å)/i-layer (film thickness: 4000 Å)/p-layer (film thickness: 100 Å)/n-layer (film thickness: 100 Å)/i-layer (film thickness: 800 Å)/p-layer (film thickness: 100 Å).

An $In_2O_3$ thin film (film thickness: 700 Å) as a transparent conductive layer 204 was then formed by deposition of In under an $O_2$ atmosphere by resistance-heating. Subsequently, a grid-type collecting electrode 205 was formed by screen printing of silver paste. Finally, a copper tab as a negative side terminal was attached on the stainless steel substrate using stainless steel solder; while a tape of tin foil as a positive side terminal was attached on the collecting electrode by means of conductive adhesive, to form output terminals 206. The photovoltaic element (solar cell) 102 was thus obtained.

A filler 103 to be provided on the light receiving surface side of the photovoltaic element 102 was prepared as follows. Sheets of vinylidene fluoride copolymer and acrylic resin were cut into pellets each having a size of several mm×several mm. The pellets were kneaded in a hopper of an extruder including a screw and a cylinder for performing melting, degassing and extrusion, thus obtaining a kneaded mixture of vinylidene fluoride copolymer and acrylic resin [polyvinylidene fluoride: acrylic resin=3:7 (wt %)]. Subsequently, 100 parts of the kneaded mixture; 10 parts of a block polymer as an acid component {trade name: Modiper H500, produced by NIPPON OIL & FATS, acid value: 120, no solvent (air dried)}; 0.3 parts of 2-hydroxy-4-octoxybenzophenone as a ultraviolet ray absorber; 0.1 parts of bis (2,2,6,6'-tetramethyl-4-piperidine) sebacate as a photo-stabilizer; 0.2 parts of tris (mono and/or di-nonylphenyl) phosphite as an oxidation inhibitor; γ-metacryloxypropyltrimethoxysilane as a silane coupling agent, and 1.5 parts of 2,5-dimethyl-2,5-bis (tert-peroxy) hexane as a cross-linking agent were mixed with each other. The mixture was extruded at 220° C. by an extruder (trade name: GPD, produced by YURI ROLL Sha) at 220° C., thus obtaining a film having a thickness of 250 µm which is used as a surface filler. The acid value of the film thus obtained was 11.

A solar cell module was prepared using the photovoltaic element 102 and the filler as follows.

A galvanized steel plate (0.8 mm thick) as a reinforcing plate 108; a 460 µm thick filler as a back face filler 107 {prepared in the same manner as in the filler 103 except that the composition of vinylidene fluoride/acrylic resin was replaced by EVA (ethylene-vinyl acetate copolymer) in the same amount and the acid component reducing the characteristics of the EVA was not used); nylon (trade name: DARTEC, produced by Du Pont Company, thickness: 75 µm) as a back face film 106, and EVA (described above) as a back surface filler 105 were laminated in this order on the back face of the conductive substrate 102 of the obtained photovoltaic element 101 from the lower side.

Next, the above film formed of the composition of vinylidene fluoride copolymer and acrylic resin as the filler 103 and tetrafluoroethylene-ethylene copolymer (non-oriented film, thickness: 50 µm) as the surface resin layer 104 were laminated in this order on the light receiving surface side of the photovoltaic element 102 form the lower side. The laminated product thus obtained was placed between an aluminum plate surrounded by an O-ring and a 2 mm thick silicon rubber sheet, the space therebetween being reduced in pressure up to 700 mmHg using a vacuum pump, and the laminated product was heated at 170° C. for 30 min in an oven, thus obtaining a solar cell module in which the coating material was integrated with the photovoltaic element.

By the above procedure, 21 solar cell modules each having a size of 30 mm×60 mm (having a photovoltaic element 102 with a size of 20 mm×45 mm) (hereinafter, referred to as "solar cell module sample A"); and 4 solar cell modules each having a size of 290 mm×400 mm (having a photovoltaic element 102 with a size of 240 mm×400 mm) (hereinafter, referred to as "solar cell module sample B") were obtained.

EXAMPLE 2

In this example, 21 solar cell module samples A and 4 solar cell modules B were obtained in the same manner as in Example 1, except that a polyvinylidene fluoride film (non-oriented film, thickness: 50 µm) was used for the surface resin layer.

EXAMPLE 3

In this example, 21 solar cell module samples A and 4 solar cell modules B were obtained in the same manner as in Example 1, except that the silane coupling agent was not added to the surface side filler.

EXAMPLE 4

In this example, 21 solar cell module samples A and 4 pieces of solar cell modules B were obtained in the same manner as in Example 1, except that the silane coupling agent and the cross-linking agent were not added to the surface side filler.

EXAMPLE 5

In this example, 21 solar cell module samples A and 4 solar cell modules B were obtained in the same manner as in Example 1, except that 10 parts of half-esterified styrene-maleic anhydride copolymer (trade name: SMA RESIN 1440, produced by ARCO CHEMICAL, Co., Ltd.) was used as the acid component, and the silane coupling agent and the cross-linking agent were not added to the surface side filler. In addition, the acid value of the filler 103 was 21.

EXAMPLE 6

In this example, 21 solar cell module samples A and 4 solar cell modules B were obtained in the same manner as in Example 5, except that the content of the half-esterified styrene-maleic anhydride copolymer (trade nam: SMA RESIN 1440, produced by ARCO CHEMICAL Co.) was reduced into one part. IN addition, the acid value of the filler 103 was 2.0.

EXAMPLE 7

In this example, 21 solar cell module samples A and 4 solar cell modules B were obtained in the same manner as in Example 1, except that the surface side filler in Example 1 was changed as follows: namely, 30 parts of the kneaded composition of polyvinylidene fluoride copolymer and acrylic resin (weight ratio of polyvinylidene fluoride/acrylic resin: 3/7) formed in the same manner as in Example 1; and 70 parts of polymethylmethacrylate as acrylic resin were mixed, and the mixture was extruded at 200° C. using the extruder (trade name: GPD, produced by YURI ROLL MACHINE Co.), thus obtaining a 250 μm thick surface side filler.

EXAMPLE 8

In this example, 21 solar cell module samples A and 4 solar cell modules B were obtained in the same manner as in Example 1, except that the surface side filler in Example 1 was changed as follows: namely, 60 parts of the kneaded composition of polyvinylidene fluoride copolymer and acrylic resin (weight ratio of polyvinylidene fluoride/acrylic resin: 7/3) formed in the same manner as in Example 1; and 40 parts of polymethylmethacrylate as acrylic resin were mixed, and the mixture was extruded at 240° C. using the extruder (trade name: GPD, produced by YURI ROLL Sha), thus obtaining a 250 μm thick surface side filler.

EXAMPLE 9

In this example, 21 solar cell module samples A and 4 solar cell modules B were obtained in the same manner as in Example 1, except that 30 parts of polyvinylidene fluoride copolymer, 70 parts of acrylic resin, 10 parts of an acid component, 0.3 parts of a ultraviolet ray absorber, 0.1 parts of photo-stabilizer, 0.2 parts of oxidation inhibitor, one part of a silane coupling agent, and 1.5 parts of a cross-linking agent were dissolved in 900 g of dimethylformaldehyde, and the resin solution thus obtained was repeatedly (10 times) applied to a solar cell by means of a wire bar and dried (150°) thus forming a 250 μm thick filler on the solar cell.

EXAMPLE 10

In this example, 21 solar cell module samples A and 4 solar cell modules B were obtained in the same manner as in Example 1, except that 30 parts of polyvinylidene fluoride copolymer, 70 parts of acrylic resin, 10 parts of an acid component, 0.3 parts of an ultraviolet ray absorber, 0.1 parts of photo-stabilizer, 0.2 parts of oxidation inhibitor, one part of a silane coupling agent, and 1.5 parts of a cross-linking agent were dissolved in 900 g of dimethylformaldehyde, and the resin solution thus obtained was applied to the surface of a tetrafluorethylene-ethylene copolymer which was subjected to corona treatment by means of a curtain flow coater and dried at a temperature between 80° C. and 200° C. for one hour, thus forming a filler having a thickness after drying of 250 μm and a surface film.

EXAMPLE 11

In this example, 21 solar cell module samples A and 4 solar cell modules B were obtained in the same manner as in Example 1, except that pellets (about 2 mm×2 mm) of polyvinylidene fluoride copolymer containing various additives and pellets (about 2 mm×2 mm) of acrylic resin containing various additives were prepared and pulverized by a crusher, respectively, thus obtaining two kinds of powders each having an average particle size of 60 μm. Each of the powders was classified using a wire-netting mesh having openings of 50 μm, to thus obtain a powder having an average particle size 25 μm. The classified powders of two kinds were mixed using a mixer, thus obtaining a powder paint. This paint was applied on a solar cell using a powder coater (100 PLUS ΠGUN SYSTEM, produced by NODSON Co.) (in this case, distance between slab and gun: 30 cm, voltage applied to gun: −50 kV).

COMPARATIVE EXAMPLE 1

In this comparative example, 21 solar cell module samples A and 4 solar cell modules B were obtained in the same manner as in Example 1, except that the material of the surface side filler was changed to EVA (the same as that of the back face filler).

COMPARATIVE EXAMPLE 2

In this comparative example, 21 solar cell module samples A and 4 solar cell modules B were obtained in the same manner as in Example 1, except that the material of the surface side filler was changed to butyral resin (thickness: 500 μm).

COMPARATIVE EXAMPLE 3

In this comparative example, a solar cell module was prepared in the same manner as in Example 1, except that the film used for the surface side filler 103 was changed to a film of polyvinylidene fluoride copolymer (PVDF). However, both interfaces of the polyvinylidene fluoride copolymer film were extremely poor in adhesion, and thereby a usable solar cell module was not obtained.

COMPARATIVE EXAMPLE 4

In this comparative example, a solar cell module was prepared in the same manner as in Comparative Example 3, except that the laminating condition of 170° C.×30 min was changed in that of 240° C.×30 min. The solar cell module thus obtained was melted at the eutectic solder connection portion, and electric output could not be obtained. Accordingly, a usable solar cell module was not obtained.

COMPARATIVE EXAMPLE 5

In this comparative example, 21 solar cell module samples A and 4 solar cell modules B were obtained in the same manner as in Example 1, except that an acrylic resin film formed in the following manner was used as the film of the surface side filler.

The above acrylic resin film was prepared as follows. Namely, methylbutylmethacrylate copolymer (trade name: DIANAL BR-102, produced by MITSUBISHI RAYON, glass transition temperature: 20° C., molecular weight: 360,000) was repeatedly (10 times) applied on ETFE and dried, thus obtaining a 460 μm thick film.

COMPARATIVE EXAMPLE 6

In this comparative example, 21 solar cell module samples A and 4 solar cell modules B were obtained in the same manner as in Example 1, except that a coating film (thickness: 6 μm) formed in the following manner was used as the film of the surface side filler.

The above coating film was prepared as follows. Namely, 100 parts of LUMIFRON LF302 (trade name, produced by Asahi Glass Co., Ltd.) and 20 parts of three monomers of hexamethylenediisocyanate (CORONATE EH, produced by Nippon Polyurethane Industry Col, Ltd.) were mixed, and the mixture was applied by screen printing, followed by heating/hardening at 120° C. for 20 min.

COMPARATIVE EXAMPLE 7

In this comparative example, 21 solar cell module samples A and 4 solar cell modules B were obtained in the same manner as in Example 1, except that a coating film (thickness; 300 µm) formed in the following manner was used as the film of the surface side filler.

The above coating film was prepared as follows. Namely, 100 parts of LUMIFRON LF302 (trade name, produced by Asahi Glass Co., Ltd.) and 20 parts of three monomers of hexamethylenediisocyanate (CORONATE EH, produced by Nippon Polyurethane Industry Co., Ltd.) were mixed. The mixture was applied using film coater (trade name: SELECTCOAT, produced by NORDSON Co., Ltd.) and dried at 60° C. for 2 hr, followed by hardening at 120° C. for 20 min.

EVALUATION

The solar cell modules obtained in Inventive Examples 1 to 11 and Comparative Examples 1, 2 and 5, 6 and 7 were evaluated in the following manner with respect to (1) weather resistance, (2) heat-resistance, (3) durability against temperature change, (4) durability against change in temperature and moisture, (5) moisture resistance, (6) bendability, and (7) scratch resistance. The results are summarized in Table 1. The solar cell modules in Comparative Examples 3 and 4 failed to be formed, and accordingly, the results thereof are not shown in Table 1.

In the evaluation of the items (1) and (5), a solar cell module sample A to be evaluated was first measured in terms of the initial conversion efficiency and the conversion efficiency after light irradiation for a specified time (corresponding to the durability in each test), and the change ratio therebetween was obtained. The change ratio thus obtained was taken as a standard (namely, 1). On the basis of the standard change ratio, the conversion efficiency of a solar cell module after a specified test was evaluated. The conversion efficiency for obtaining the above standard change ratio was measured as follows: Namely, a pseudo-sunshine spectrum of AM 1.5 was irradiated to a solar cell module sample A at a temperature of 25° C. and at a moisture of 50% using a pseudo-sunshine source with a light intensity of 100 mW/cm$^2$ (trade name: SPI-SUN Simulator 240A, produced by SPIRE Co., Ltd.), and the initial conversion efficiency and the conversion efficiency after an elapse of a specified time were measured.

In the evaluation of the items (2), (3), and (4), a solar cell module sample B was previously measured in terms of the initial conversion efficiency and the conversion efficiency after light irradiation for a specified time (corresponding to the durability in each test), and the change ratio therebetween was obtained. The change ratio thus obtained was taken as a standard (namely, 1). On the basis of the standard change ratio, the conversion efficiency of a solar cell module after a specified test was evaluated. The conversion efficiency for obtaining the above standard change ratio was measured as follows: Namely, a pseudo-sunshine at a sunshine spectrum of AM 1.5 was irradiated to a solar cell module sample B at a temperature of 25° C. and 50% moisture using a pseudo-sunshine source with a light intensity of 100 mW/cm$^2$ (trade name: Xenon Lamp YSS80, produced by YAMASHITA DENSO Co.), and the initial conversion efficiency and the conversion efficiency after an elapse of a specified time were measured.

(1) Weather Resistance

The solar cell module samples A were placed in a sunshine weather meter (trade name: Sunshine Weather Meter WEL-300, produced by SUGA TESTER Kabusiki Kaisha), and were repeatedly subjected to a test cycle for 8000 hr in which light irradiation was made for 102 min and water spray in a dark ambient (moisture: 65% RH) was made for 18 min under the conditions of illuminance: 410 W/m$^2$, wavelength; 300–700 nm, black panel: 63° C. In this test, the conversion efficiencies of each solar cell module sample A were measured. The average value of the conversion efficiencies was compared with the above standard change ratio, and the variation (in percentage) relative to the standard change ratio is shown in Table 1. In addition, the test is based on JIS A-1415 specified for observing the weather resistance of a solar cell module to be used for 20 years.

(2) Heat Resistance

The solar cell module sample B was left in an atmosphere at 150° C. for 50 hr, and the appearance thereof was observed, and further the conversion efficiency was measured and the measured result was compared with the above standard change ratio.

The evaluation was performed on the basis of the following evaluation reference standards. The results are shown in Table 1.

⊚: change in appearance, none; and variation relative to standard change ratio, 5% or less ○: change in appearance, little; and variation relative to standard change ratio, 5–10%

Δ: change in appearance, slight but not significant in practical use; and variation relative to the standard change ratio, 10–20%

X: change in appearance, significant (separation, cracking, and coloring harming reliability are observed); and variation relative to the standard change ratio, 20% or more (3) Durability Against Change in Temperature The solar cell module sample B was repeatedly subjected to a test cycle (–40° C./1 hr: 85° C./4 hr) for 50 times, the appearance thereof was observed, and the conversion efficiency was measured and compared with the standard change ratio.

The evaluation was performed on the basis of the following evaluation reference standards. The results are shown in Table 1.

○: change in appearance, none; and variation relative to standard change ratio, 5% or less Δ: change in appearance, little; and variation relative to standard change ratio, 5–10%

X: change in appearance, significant (separation, cracking, and coloring harming reliability are observed); and variation relative to the standard change ratio, 10% or more (4) Durability Against Change in Temperature and Moisture The solar cell module sample B was repeatedly subjected to a test cycle (–40° C./1 hr: 85° C./85% RH/4 hr) for 20 times, the appearance thereof was observed, the conversion efficiency was measured, and the measured result was compared with the standard change ratio.

The evaluation was performed on the basis of the following evaluation reference standards. The results are shown in Table 1.

○: change in appearance, none; and variation relative to standard change ratio, 5% or less Δ: change in appearance, little; and variation relative to standard change ratio, 5–10%

X: change in appearance, significant (separation, cracking, and coloring largely harming reliability are observed); and variation relative to the standard change ratio, 10% or more (5) Moisture Resistance The solar cell module samples A were placed in an atmosphere of 85°/85% RH for 24 hr, and the conversion efficiency of each sample A was measured while being irradiated by pseudo-sunshine at a sunshine spectrum of AM 1.5 using a pseudo-sunshine source (trade name: Xenon Lamp YSS800, produced YAMASHITA DENSO Kabushiki Kaisha). The average value of the measured results was compared with the above standard change ratio. The variation (in percentage) relative to the standard change ratio was shown in Table 1.

(6) Bendability

With respect to the solar cell module sample B, a portion laminated with the reinforcing member was bent at a curvature of 10 mmR, and was evaluated in terms of the presence or absence of cracking or breaking.

The evaluation was performed on the basis of the following evaluation reference standards. The results are shown in Table 1.

○: cracking or breaking, none
X: cracking and/or breaking, yes (7) Scratching Resistance The solar cell module sample A was held at angles of 45°, and on the sample A, sand having particle sizes under 100 mesh were naturally dropped from a height of 1 m at a dropping rate of 10 g/min for 100 min. Scratches generated on the surface resin layer were observed.

The evaluation was performed using the following evaluation reference standards. The results are shown in Table 1.

○: scratching, none
Δ: scratching, slight
X: scratching, yes

As is apparent from Table 1, in the solar cell module of the present invention in which the solar cell is coated with a coating material excellent in weather resistance, heat resistance, moisture resistance, adhesion, mechanical strength, and workability, the solar cell is stably held and achieves a desirable photoelectric conversion efficiency even in severe operational environments.

The effect of the present invention will be described below. A coating with excellent weather resistance can be achieved. Specifically, the coating with excellent weather resistance can be achieved by provision of a filler using a composition of a vinylidene fluoride copolymer as a fluororesin and an acrylic resin. Differently from the case of using the conventional EVA, the above filler is not yellowed during use over a long period of time, thus preventing the deterioration in conversion efficiency of the solar cell.

According to the above construction, the chemical structure does not have excessive hydroxyl groups, so that the surface coating material is excellent in moisture resistance. Differently from the conventional butyral resin, the filler can prevent moisture absorption in a high moisture environment, that is, it can prevent moisture from easily permeating into the solar cell. This makes it difficult to generate electric short-circuits in the solar cell. The above filler also eliminates irreversible devitrification which is the critical defect of butyral resin, thus preventing the deterioration in the conversion efficiency of the solar cell.

A coating excellent in thermo-compression bonding can be achieved by specifying the weight ratio between vinylidene fluoride copolymer and acrylic resin, which are used for the filler, in the range of from 1/9 to 4/6. Specifically, thermo-compression bonding becomes possible at a relatively low temperature by specifying the weight ratio between vinylidene fluoride copolymer and acrylic resin in the range of from 1/9 to 4/6. When the above weight ratio is larger than 4/6, heat-melting requires a high temperature of 200° C. or more. Consequently, in the case where a collecting electrode is formed of conductive paste containing resin, the resin is excessively cross-linked or oxidized by the above high temperature treatment, which possibly harms the long-term reliability of the solar cell module. Moreover, although being heat-melted, the filler is relatively low in bonding force, and is difficult to keep the bonding force for a long period of time. On the other hand, when the above mixing ratio (namely, the weight ratio) is less than 1/9, the weather resistance of vinylidene fluoride copolymer cannot be expected.

A filler excellent in adhesion can be achieved by specifying the acid value thereof in the range of from 5 to 50. Namely, the acid component is effective to improve the adhesion with a photovoltaic element or surface resin layer.

The coating can be further improved in adhesion using a graft copolymer or block polymer containing acid as a component. Namely, in this case, the coating can exhibit stable adhesion for a long period of time even in severe environments. Moreover, the moisture permeability can be suppressed by reducing the added amount of the acid component.

A coating excellent in heat resistance can be achieved by cross-linking the filler. Specifically, the cross-linked filler prevents a problem in that it is softened or peeled during use at a high temperature. The coating, which is made of fluororesin, is also excellent in heat resistance. The coating prevents a problem in that as in the case of the conventional butyral resin, the added oxidation inhibitor is volatilized during use at a high temperature, and the yellowing is accelerated; consequently, it prevents the deterioration in the conversion efficiency of the solar cell. Moreover, by the addition of a coupling agent into the filler, the above adhesion can be further enhanced.

A coating excellent in weather resistance can be achieved using tetrafluoroethylene-ethylene copolymer as a surface resin layer provided on the filler. Namely, weather resistance is enhanced by the effect of tetrafluorethylene-ethylene copolymer together with fluororesin constituting the filler, and thereby a solar cell module having a high mechanical strength can be achieved. Of fluororesin films, tetrafluoroethylene-ethylene copolymer film has the highest breaking strength and breaking elongation, so that it assures the stable surface coating against impact and stress from the exterior, for example, sandstorms and hailstorms.

A coating excellent in post-workability can be achieved using non-oriented tetrafluoroethylene-ethylene copolymer. Namely, in the solar cell module using oriented tetrafluoroethylene-ethylene copolymer, when the end portion of the module is bent, cracking or breaking is generated on the surface resin layer, and accordingly, water repellency and moisture resistance of the tetrafluorethylene-ethylene copolymer constituting the outermost surface cannot be expected. The above cracking or breaking can be prevented using a non-oriented film. Also, the non-oriented film is small in heat contraction ratio, and in contraction stress after heat-bonding.

In summary, using a mixture of vinylidene fluoride copolymer and acrylic resin for at least the filler on the light receiving surface of the solar cell module, it becomes possible to enhance weather resistance, heat resistance, and moisture resistance, and to prevent the reduction in the conversion efficiency of the solar cell module. Moreover, the interfacial adhesion of the coating material can be assured for a long period of time by introducing an acid component to the filler. In addition, the solar cell module of the present invention can be manufactured in the same manner as that for the conventional filler made of EVA or butyral resin, so that the equipment can be simplified.

TABLE 1

| | weather resistance | heat resistance | durability against temperature change | durability against change in temperature and moisture | moisture resistance | bendability | scratch resistance |
|---|---|---|---|---|---|---|---|
| Example 1 | 0 | ◎ | ○ | ○ | 12 | ○ | ○ |
| Example 2 | 0 | ◎ | ○ | ○ | 15 | ○ | ○ |
| Example 3 | 0 | ◎ | ○ | ○ | 19 | ○ | ○ |
| Example 4 | 0 | ○ | ○ | ○ | 30 | ○ | ○ |
| Example 5 | 3 | ○ | ○ | ○ | 26 | ○ | ○ |
| Example 6 | 0 | ○ | ○ | ○ | 14 | ○ | ○ |
| Example 7 | 4 | ○ | ○ | ○ | 34 | ○ | ○ |
| Example 8 | 0 | ○ | ○ | ○ | 13 | ○ | ○ |
| Example 9 | 0 | ◎ | ○ | ○ | 12 | ○ | ○ |
| Example 10 | 0 | ◎ | ○ | ○ | 12 | ○ | ○ |
| Example 11 | 0 | ◎ | ○ | ○ | 12 | ○ | ○ |
| Comparative Example 1 | 9 | ◎ | ○ | ○ | 64 | ○ | ○ |
| Comparative Example 2 | 4 | ○ | ○ | X | 87 | ○ | ○ |
| Comparative Example 5 | 0 | ○ | Δ | Δ | 25 | X | ○ |
| Comparative Example 6 | 10 | ○ | ○ | ○ | 63 | ○ | Δ |
| Comparative Example 7 | 10 | ○ | ○ | X | 37 | Δ | Δ |

What is claimed is:

1. A power supplying means comprising a photovoltaic element in which at least the light incident surface side of the photovoltaic element is coated with a filler, wherein said filler is formed of a composition containing a vinylidene fluoride copolymer and an acrylic resin, and a reinforcing material is disposed on the back face side of said photovoltaic element.

2. A power supplying means according to claim 1, wherein the reinforcing material is selected from the group consisting of a steel plate, coated steel plate, plastic plate, and glass fiber reinforced plastic plate.

* * * * *

UNITED STATES PATENT AND TRADEMARK OFFICE
CERTIFICATE OF CORRECTION

PATENT NO. : 5,718,772
DATED : February 17, 1998
INVENTOR(S) : TAKAHIRO MORI, ET AL.

It is certified that error appears in the above-identified patent and that said Letters Patent is hereby corrected as shown below:

COLUMN 2

Line 18, "is" (second occurrence) should read --in--.

COLUMN 5

Line 24, "than" should read --that--.

COLUMN 13

Line 7, "$SiH_4$ and $H^2$)" should read --$SiH_4$ and $H_2$)--.

COLUMN 16

Line 33, "in" should read --to--.

COLUMN 22

Line 30, "plate,," should read --plate,--.

Signed and Sealed this

Eighteenth Day of August, 1998

*Attest:*

BRUCE LEHMAN

*Attesting Officer*　　　　　*Commissioner of Patents and Trademarks*